(12) United States Patent
Hsieh et al.

(10) Patent No.: US 11,574,496 B2
(45) Date of Patent: Feb. 7, 2023

(54) FINGERPRINT RECOGNITION DEVICE

(71) Applicant: Au Optronics Corporation, Hsinchu (TW)

(72) Inventors: Shang-Wei Hsieh, Hsinchu (TW);
Ken-Yu Liu, Hsinchu (TW);
Chao-Chien Chiu, Hsinchu (TW);
Yan-Liang Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/513,886

(22) Filed: Oct. 29, 2021

(65) Prior Publication Data
US 2022/0375250 A1 Nov. 24, 2022

Related U.S. Application Data

(60) Provisional application No. 63/189,960, filed on May 18, 2021.

(30) Foreign Application Priority Data

Aug. 24, 2021 (TW) ................................. 110131173

(51) Int. Cl.
G06V 40/13 (2022.01)
G02F 1/13357 (2006.01)
G02F 1/1335 (2006.01)
G06V 40/12 (2022.01)

(52) U.S. Cl.
CPC .... *G06V 40/1318* (2022.01); *G02F 1/133526* (2013.01); *G02F 1/133603* (2013.01); *G06V 40/1341* (2022.01)

(58) Field of Classification Search
None
See application file for complete search history.

(56) References Cited

U.S. PATENT DOCUMENTS

| | | | | |
|---|---|---|---|---|
| 2021/0151511 A1* | 5/2021 | Kim | ........................ | G06F 3/042 |
| 2021/0333441 A1* | 10/2021 | Schwartz | ............. | G06V 10/147 |
| 2022/0114356 A1* | 4/2022 | Hsu | ........................ | G02B 5/3058 |

FOREIGN PATENT DOCUMENTS

| | | |
|---|---|---|
| CN | 111563426 | 8/2020 |
| TW | M602226 | 10/2020 |

* cited by examiner

*Primary Examiner* — Joseph R Haley
(74) *Attorney, Agent, or Firm* — JCIPRNET

(57) ABSTRACT

A fingerprint recognition device including a light emitting layer, an image sensing layer and a micro-lens layer is provided. The image sensing layer has a plurality of pixels. The micro-lens layer is disposed between the light emitting layer and the image sensing layer and has a plurality of micro lenses respectively corresponding to the pixels. A distance between the micro-lens layer and the light emitting layer is less than or equal to 800 um and greater than or equal to h1, where h1=(x/2×tan θ), x is the minimum distance between two micro lenses respectively corresponding to different pixels on a plane where the micro-lens layer is disposed, and θ is an FWHM light receiving angle of each of the micro lenses.

10 Claims, 7 Drawing Sheets

FINGERPRINT RECOGNITION DEVICE

CROSS-REFERENCE TO RELATED APPLICATION

This application claims the priority benefit of U.S. provisional application Ser. No. 63/189,960, filed on May 18, 2021 and the priority benefit of Taiwan application serial no. 110131173, filed on Aug. 24, 2021. The entirety of each of the above-mentioned patent applications is hereby incorporated by reference herein and made a part of this specification.

BACKGROUND

Technical Field

The disclosure relates to an optical sensing device and particularly relates to a fingerprint recognition device.

Description of Related Art

Fingerprint signals detected by an in-display fingerprint recognition sensor are transmitted downward through a transparent region of a self-illuminating light emitting panel, collected by an underlying micro-lens layer, and then incident to the sensor. Since a light receiving angle of each micro lens has a constant value, it is necessary to maintain a proper distance between the self-illuminating light emitting panel and the micro-lens layer to avoid an issue of non-uniform brightness. In addition, the light receiving angle of each micro lens should be optimized to prevent crosstalk. However, due to a small angle range of the optimized light receiving angle, the sensor becomes sensitive to the distance between the self-illuminating light emitting panel and the micro-lens layer. If the distance between the self-illuminating light emitting panel and the micro-lens layer is improperly set, the issue of non-uniform brightness may arise.

SUMMARY

The disclosure provides a fingerprint recognition device which prevents issues of crosstalk and non-uniform brightness.

According to an embodiment of the disclosure, a fingerprint recognition device including a light emitting layer, an image sensing layer, and a micro-lens layer is provided. The image sensing layer has a plurality of pixels. The micro-lens layer is disposed between the light emitting layer and the image sensing layer and has a plurality of micro lenses respectively corresponding to the pixels. A distance between the micro-lens layer and the light emitting layer is less than or equal to 800 um and greater than or equal to h1, where h1=x/(2×tan θ), x is the minimum distance between two micro lenses respectively corresponding to different pixels on a plane where the micro-lens layer is disposed, and θ is a full-width-at-half-maximum (FWHM) light receiving angle of each of the micro lenses.

In view of the above, in the fingerprint recognition device provided in one or more embodiments of the disclosure, the minimum distance between the micro-lens layer and the light emitting layer is subject to the light receiving angle of each of the micro lenses and the distance between the micro lenses, so as to prevent the issue of non-uniform brightness resulting from the insufficient distance between the micro-lens layer and the light emitting layer.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
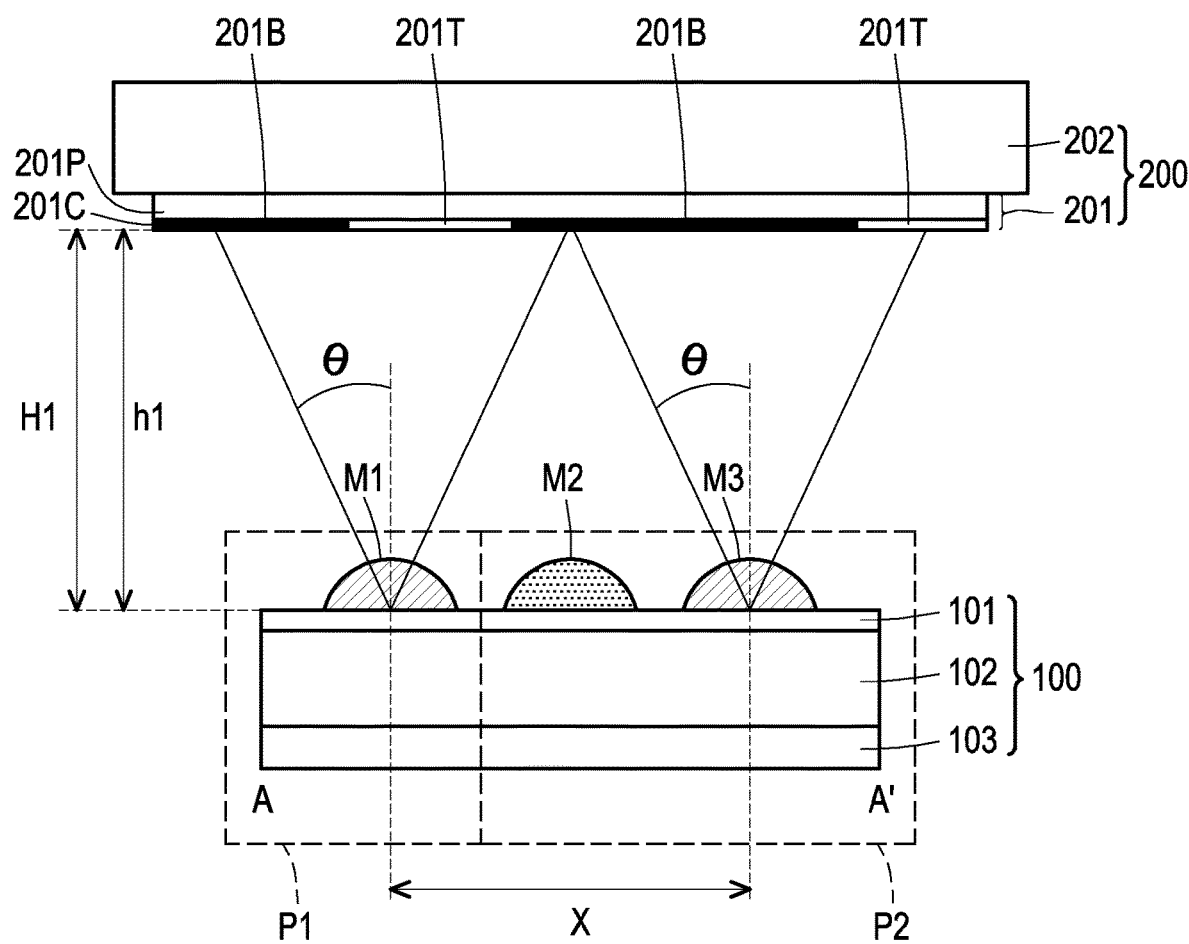
FIG. 1A is a schematic cross-sectional view of a fingerprint recognition device according to an embodiment of the disclosure.
Figure 1B:
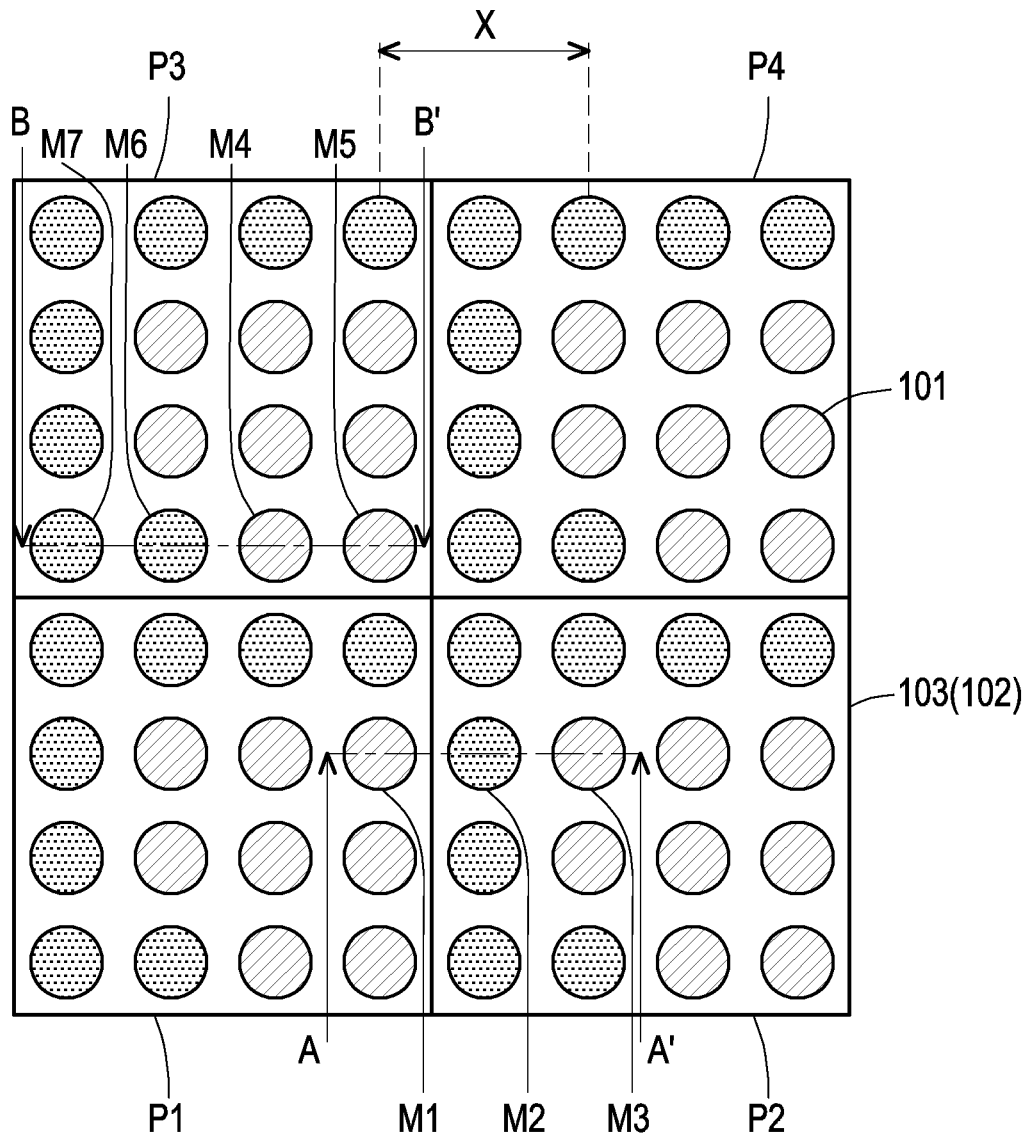
FIG. 1B is a schematic plan view of an image detection portion of a fingerprint recognition device according to an embodiment of the disclosure.
Figure 1C:
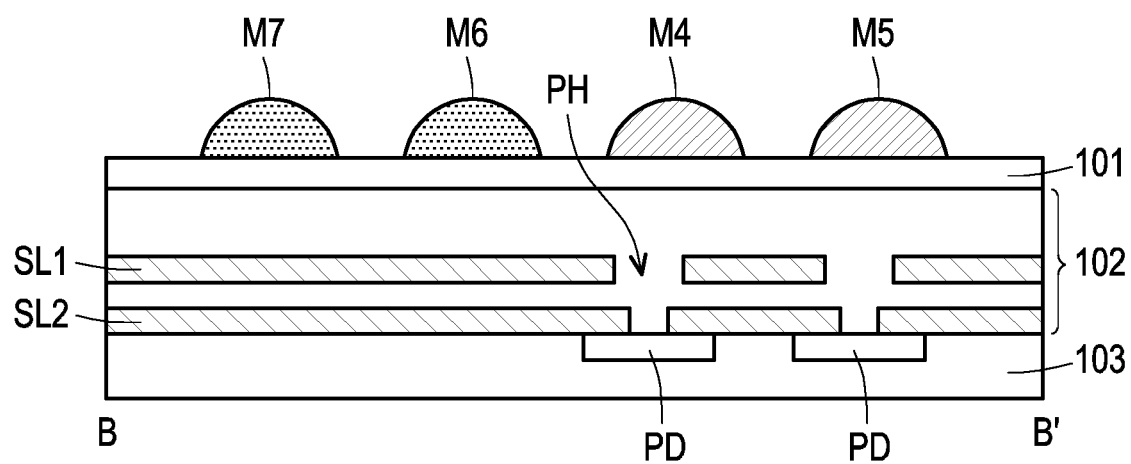
FIG. 1C is a schematic cross-sectional view of an image detection portion of a fingerprint recognition device according to an embodiment of the disclosure.

With reference to FIG. 1A, FIG. 1B, and FIG. 1C, a cross-section depicted in FIG. 1A corresponds to a line segment AA' shown in FIG. 1B, and a cross-section depicted in FIG. 1C corresponds to a line segment BB' shown in FIG. 1B.

A fingerprint recognition device 1 provided in this embodiment includes an image detection portion 100 and an image generating portion 200. The image generating portion 200 includes a light emitting layer 201 and a transparent cover plate 202, and the image detection portion 100 includes a micro-lens layer 101 and an image sensing layer 103. The micro-lens layer 101 is disposed between a light emitting layer 201 and the image sensing layer 103. The image sensing layer 103 has a plurality of pixels.

In this embodiment, four pixels P1, P2, P3, and P4 of the image sensing layer 103 are exemplarily illustrated. The micro-lens layer 101 has a plurality of micro lenses respectively corresponding to the pixels P1, P2, P3, and P4, as shown in FIG. 1B. With reference to FIG. 1A and FIG. 1B, the micro lens M1 corresponds to the pixel P1, the micro lens M3 corresponds to the pixel P2, and a dummy micro lens M2 is disposed between the micro lenses M1 and M3 and corresponds to the pixel P2. As shown in FIG. 1B, the pixels P1, P2, P3, and P4 all correspond to a plurality of micro lenses and are illustrated in the same manner as illustrating the micro lenses M1 and M3, and the pixels P1, P2, P3, and P4 all correspond to a plurality of dummy micro lenses and are illustrated in the same manner as illustrating the dummy micro lens M2.

In this embodiment, the light emitting layer 201 is a self-illuminating display panel and includes a display medium layer 201P and a circuit layer 201C, and the light emitting layer 201 has a transparent region 201T and a non-transparent region 201B. The non-transparent region 201B corresponds to one region of the circuit layer 201C where a circuit trace is disposed, and the transparent region 201T corresponds to the other region of the circuit layer 201C where no circuit trace is disposed. Light emitted by the light emitting layer 201 irradiates a user's finger on the transparent cover plate 202. After the light is reflected by the finger, the light passes through the transparent region 201T and travels toward the image detection portion 100.

As shown in FIG. 1A, the micro lenses M1 and M3 respectively correspond to different pixels P1 and P2, and their FWHM light receiving angles are both θ, where the FWHM light receiving angle refers to an angle at which a brightness of a received light beam is half a brightness of a received light beam at a front view angle (i.e., θ=0). A distance between the image detection portion 100 and the image generating portion 200 is H1. As shown in FIG. 1A, the micro lenses M1 and M3 respectively correspond to different pixels P1 and P2, and the FWHM light receiving angles of the micro lenses M1 and M3 both correspond to the transparent region 201T.

Figure 2:
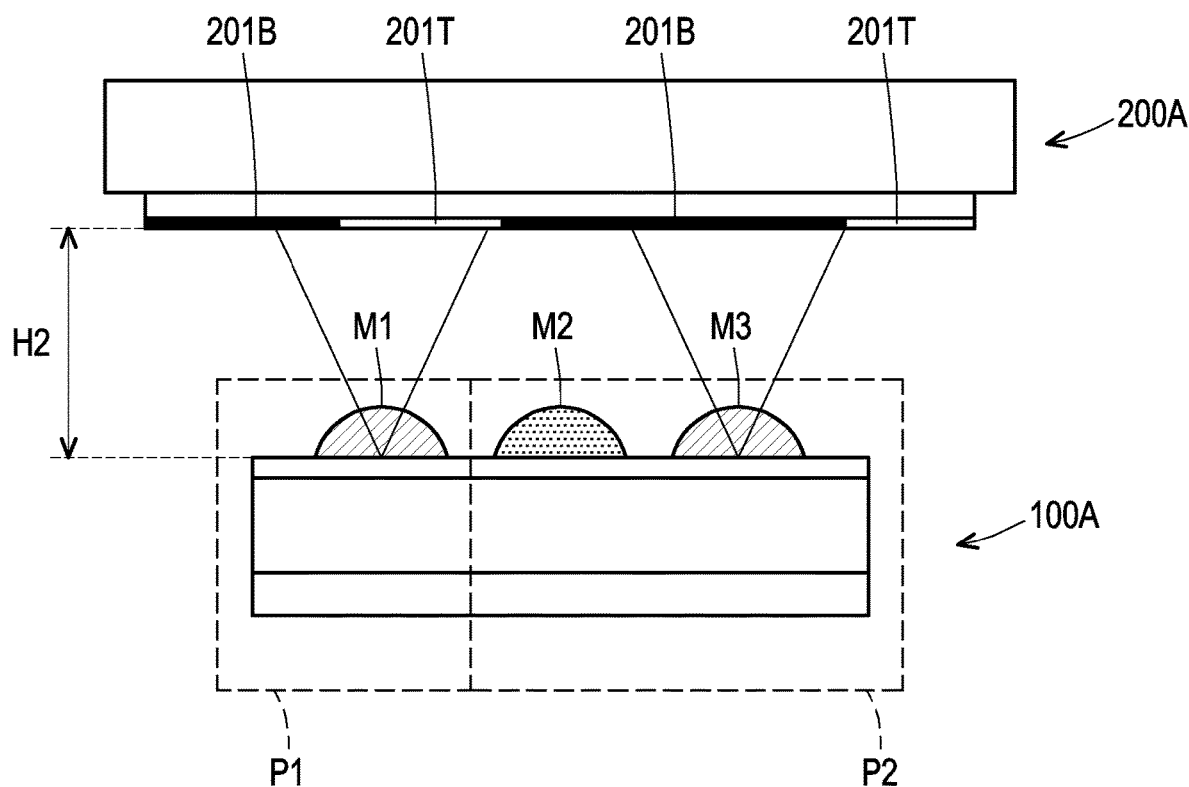
FIG. 2 is a schematic view of a fingerprint recognition device according to a comparative example.

Please refer to FIG. 2, which is a schematic view of a fingerprint recognition device according to a comparative example. For easy description, a fingerprint recognition device 2 provided in the comparative example has an image detection portion 100A and an image generating portion 200B, and the configuration of the image detection portion 100A and the image generating portion 200A is similar to the configuration of the image detection portion 100 and the image generating portion 200 provided in the embodiment shown in FIG. 1A. The difference between the two embodiments respectively shown in FIG. 1A and FIG. 2 lies in that a distance between the image detection portion 100A and the image generating portion 200A is H2, and H2 is less than H1.

In comparison with FIG. 1A, the distance between the image detection portion 100A and the image generating portion 200A in FIG. 2 is overly short, the micro lenses M1 and M3 corresponding to different pixels P1 and P2 do not correspond to the transparent region 201T at the same time, and the FWHM light receiving angles of the micro lenses M1 and M3 are not spatially connected to each other. The condition illustrated in FIG. 2 may lead to the issue of non-uniform brightness of light sensed by the pixels P1 and P2. By contrast, as shown in FIG. 1A, by properly setting the distance between the image detection portion 100 and the image generating portion 200, the FWHM light receiving angles of the micro lenses M1 and M3 corresponding to different pixels P1 and P2 may both correspond to the transparent region 201T, and the FWHM light receiving angles of the like micro lenses M1 and M3 are spatially connected to each other.

Specifically, the distance H1 between the micro-lens layer 101 and the light emitting layer 201, as provided in the embodiment shown in FIG. 1A, is set to be less than or equal to 800 um and greater than or equal to h1, where h1=x/(2×tan θ), x is the minimum distance between the micro lenses corresponding to different pixels on a plane where the micro-lens layer is located, and θ is the FWHM light receiving angle of each micro lens. With reference to FIG. 1A and FIG. 1B, the distance between the micro lenses M1 and M3 on the plane where the micro-lens layer 101 is located is the minimum distance x between the micro lenses corresponding to different pixels in this embodiment.

With reference to FIG. 1C, the image detection portion 100 further includes a collimation layer 102 disposed between the image sensing layer 103 and the micro-lens layer 101. Here, the collimation layer 102 includes light blocking layers SL1 and SL2 and a plurality of light transmitting holes PH, and these light transmitting holes PH correspond to micro lenses M4 and M5, respectively. Dummy micro lenses M6 and M7 neither correspond to the light transmitting holes PH nor correspond to a photodiode PD.

In this embodiment, the dummy micro lenses M6 and M7 do not correspond to the light transmitting holes PH at all, but the micro lenses M4 and M5 both correspond to two light transmitting hole PH, which should however not be construed as a limitation in the disclosure. In other embodiments, the dummy micro lenses M6 and M7 may respectively correspond to one light transmitting hole PH. Particularly, the number of the light transmitting holes PH corresponding to the dummy micro lenses M2, M6, and M7 is less than the number of the light transmitting holes PH corresponding to the micro lenses M1, M3, M4, and M5.

To sufficiently describe various implementation examples and aspects of the disclosure, several other embodiments of the disclosure are described below. Note that the reference numerals and a part of the contents in the previous embodiment are applicable to the following embodiments, in which identical reference numerals indicate identical or similar components, and repeated descriptions of the same technical contents are omitted. For the detailed descriptions of the omitted parts, reference can be found in the previous embodiment, and no repeated description is contained in the following embodiments.

Figure 3:
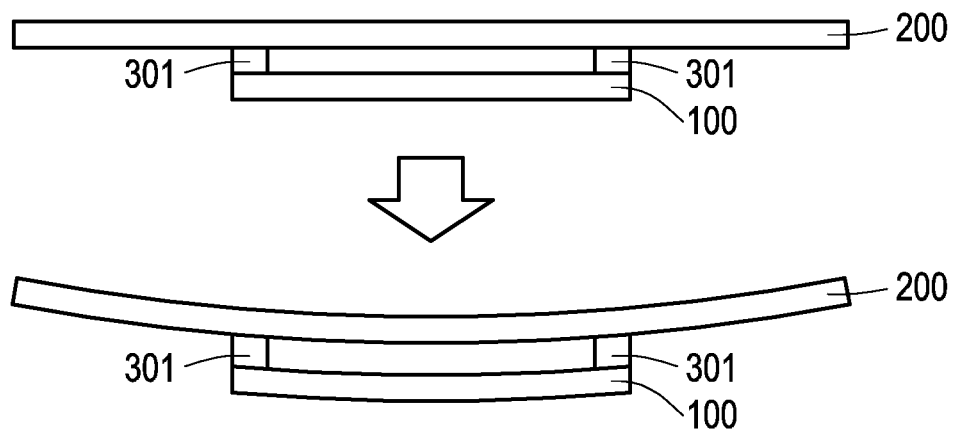
FIG. 3 is a schematic view of a fingerprint recognition device according to an embodiment of the disclosure.

With reference to FIG. 3, which is a schematic view of a fingerprint recognition device according to an embodiment of the disclosure. A fingerprint recognition device 3 includes the image detection portion 100, the image generating portion 200, and a support frame 301. The support frame 301 is disposed between the image detection portion 100 and the image generating portion 200, i.e., between the micro-lens layer 101 and the light emitting layer 201. Here, a Young's modulus of the support frame 301 is greater than or equal to 1 MPa. In this embodiment, since the Young's modulus of the support frame 301 is relatively large, the resultant strain in response to a stress is small. Therefore, when the stress is exerted to the fingerprint recognition device 3, the distance between the image detection portion 100 and the image generating portion 200 is not changed by the exerted stress. The distance between the image detection portion 100 and the image generating portion 200 may be the same as the distance H1 provided in the embodiment depicted in FIG. 1A to FIG. 1C and may be less than or equal to 800 um and greater than or equal to h1; here, h1=x/(2×tan θ), x is the minimum distance between the micro lenses corresponding to different pixels on the plane where the micro-lens layer is located, and θ is the FWHM light receiving angle of each micro lens.

Figure 4:
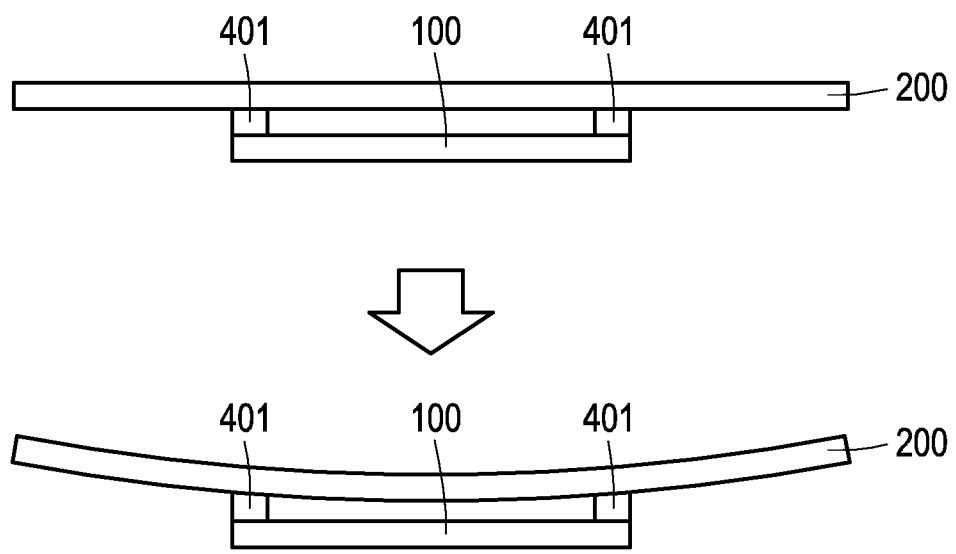
FIG. 4 is a schematic view of a fingerprint recognition device according to an embodiment of the disclosure.

By contrast, please refer to FIG. 4, which is a schematic view of a fingerprint recognition device according to an embodiment of the disclosure. A fingerprint recognition device 4 includes the image detection portion 100, the image generating portion 200, and a support frame 401. The support frame 401 is disposed between the image detection portion 100 and the image generating portion 200, wherein the Young's modulus of the support frame 401 is less than 1 MPa. In this embodiment, since the Young's modulus of the support frame 401 is relatively small, the resultant strain in response to a stress is large. Therefore, when the stress is exerted to the fingerprint recognition device 4, the distance between the image detection portion 100 and the image generating portion 200 is shortened due to the exerted stress, as shown in the lower half of FIG. 4.

Figure 5:
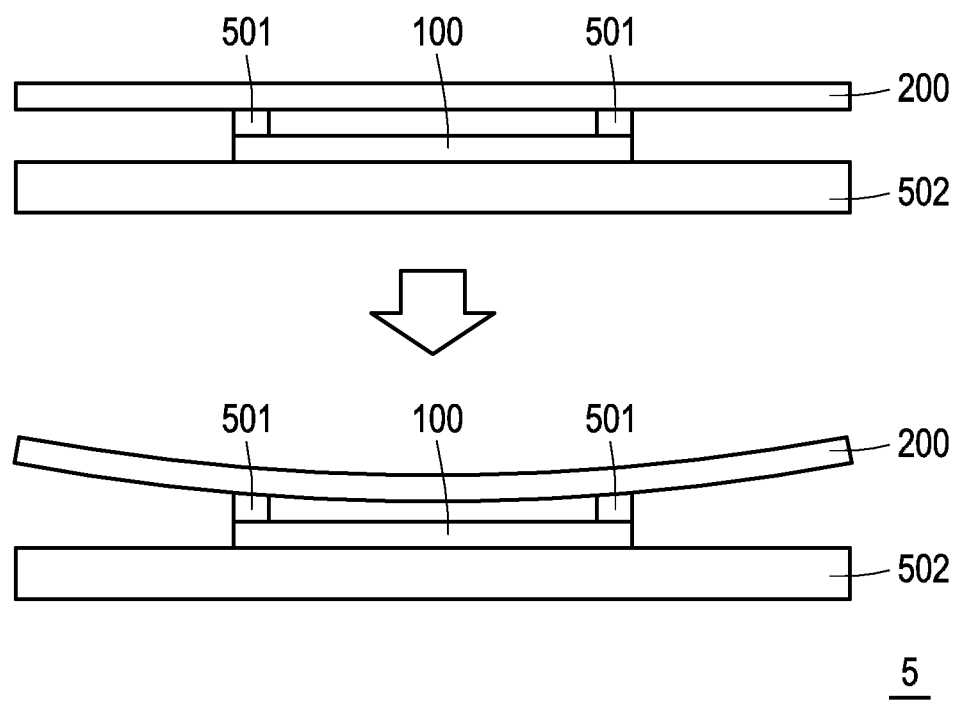
FIG. 5 is a schematic view of a fingerprint recognition device according to an embodiment of the disclosure.

Please refer to FIG. 5, which is a schematic view of a fingerprint recognition device according to an embodiment of the disclosure. A fingerprint recognition device 5 includes the image detection portion 100, the image generating portion 200, a support frame 501, and a base plate 502. The support frame 501 is disposed between the image detection portion 100 and the image generating portion 200, and the image detection portion 100 is disposed between the base plate 502 and the image generating portion 200. Since the image detection portion 100 abuts on the base plate 502, when a stress is exerted to the fingerprint recognition device 5, the distance between the image detection portion 100 and the image generating portion 200 is shortened due to the exerted stress, as shown in the lower half of FIG. 5.

Specifically, in the embodiment shown in FIG. 4 and FIG. 5, the distance between the image detection portion 100 and the image generating portion 200 is shortened due to the exerted stress; in this case, the distance between the image detection portion 100 and the image generating portion 200 should be greater than the distance H1 provided in the embodiment illustrated in FIG. 1A to FIG. 1C, which will be further explained in the following embodiment illustrated in FIG. 6.

Figure 6:
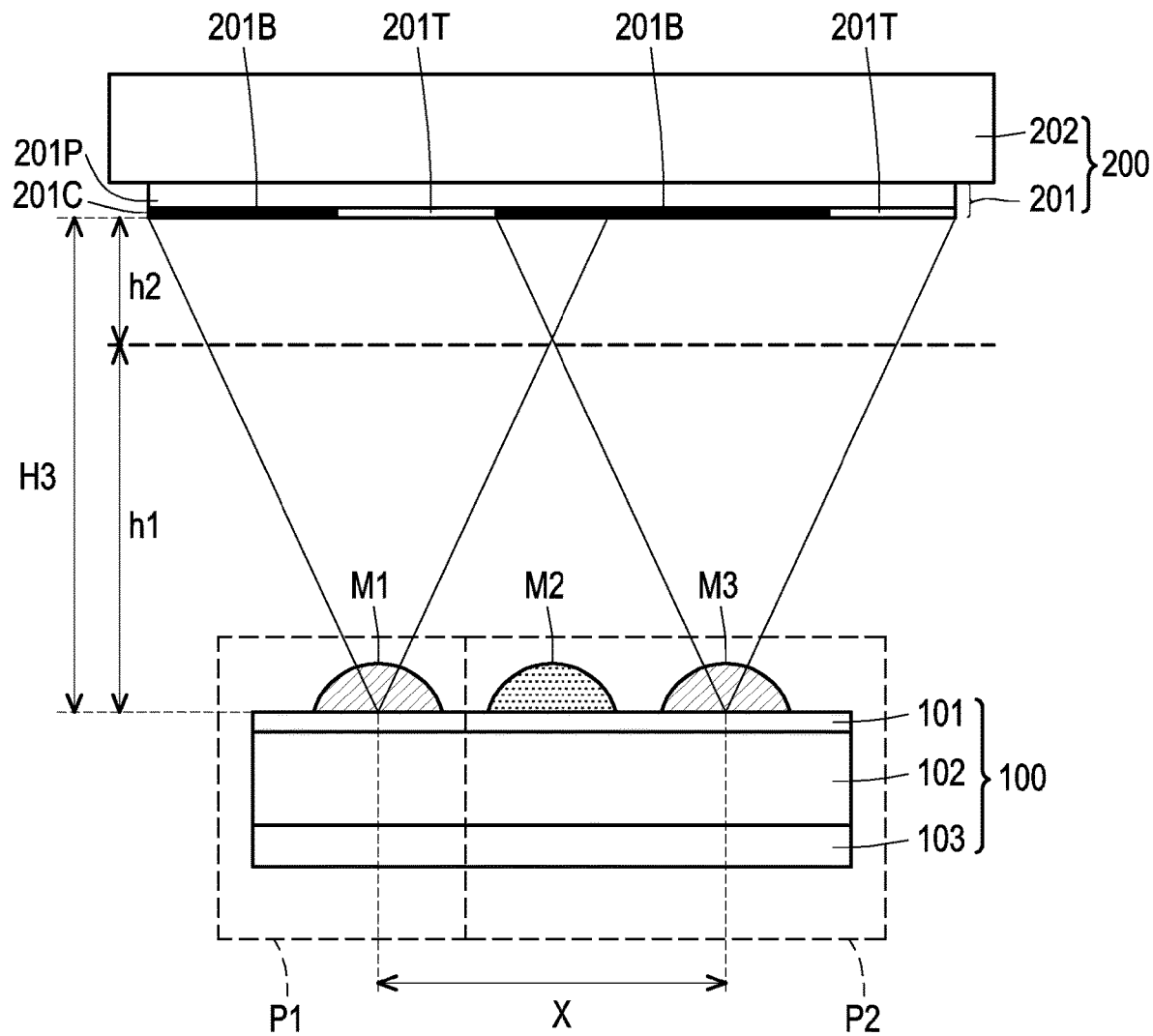
FIG. 6 is a schematic cross-sectional view of a fingerprint recognition device according to an embodiment of the disclosure.

In consideration of the condition that the distance between the image detection portion 100 and the image generating portion 200 is shortened due to the exerted stress, please refer to FIG. 6, which is a schematic cross-sectional view of a fingerprint recognition device according to an embodiment of the disclosure. A fingerprint recognition device 6 includes the image detection portion 100 and the image generating portion 200. Here, the image generating portion 200 includes the transparent cover plate 202, a distance H3 between the micro-lens layer 101 and the light emitting layer 201 is set to be less than or equal to 800 um and greater than or equal to h1+h2, where $h1=x/(2\times\tan\theta)$, $h2=6.045E^{-7}\times N\times L^2/t^3$, x is the minimum distance between the micro lenses corresponding to different pixels on the plane where the micro-lens layer is located (i.e., the distance between the micro lenses M1 and M3 on the plane where the micro-lens layer 101 is located, as shown in FIG. 6), θ is the FWHM light receiving angle of each micro lens, N is a force at a center point of the fingerprint recognition device 6 (Newton (N)), L is the maximum size of the transparent cover plate 202 on a plane where the transparent cover plate 202 is located, i.e., the length of a diagonal (mm) of the transparent cover plate 202, and t is the total thickness (mm) of the transparent cover plate 202 and the light emitting layer 201. For instance, when a force of 6 N is applied to the center point of the fingerprint recognition device 6, the distance H3 is less than or equal to 800 um and greater than or equal to h1+h2, where $h1=x/(2\times\tan\theta)$, and $h2=3.627E^{-6}\times L^2/t^3$.

To sum up, in the fingerprint recognition device provided in one or more embodiments of the disclosure, the minimum distance between the micro-lens layer and the light emitting layer is subject to the light receiving angle of each of the micro lenses and the distance between the micro lenses, so as to prevent the issue of non-uniform brightness resulting from the insufficient distance between the micro-lens layer and the light emitting layer.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A fingerprint recognition device, comprising:
a light emitting layer;
an image sensing layer, having a plurality of pixels; and
a micro-lens layer, disposed between the light emitting layer and the image sensing layer and having a plurality of micro lenses respectively corresponding to the pixels,
wherein a distance between the micro-lens layer and the light emitting layer is less than or equal to 800 um and greater than or equal to h1, $h1=x/(2\times\tan\theta)$, x is a minimum distance between the micro lenses respectively corresponding to different pixels of the pixels on a plane where the micro-lens layer is disposed, and θ is a full-width-at-half-maximum light receiving angle of each of the micro lenses.

2. The fingerprint recognition device according to claim 1, wherein the light emitting layer comprises a transparent region and a non-transparent region.

3. The fingerprint recognition device according to claim 1, further comprising a transparent cover plate, wherein the light emitting layer is located between the transparent cover plate and the micro-lens layer, the distance between the micro-lens layer and the light emitting layer is greater than or equal to h1+h2, $h2=3.627E^{-6}\times L^2/t^3$, L is a maximum size of the transparent cover plate on a plane where the transparent cover plate is located, and t is a total thickness of the transparent cover plate and the light emitting layer.

4. The fingerprint recognition device according to claim 3, further comprising a base plate, wherein the image sensing layer is disposed between the base plate and the micro-lens layer.

5. The fingerprint recognition device according to claim 3, further comprising a support frame disposed between the micro-lens layer and the light emitting layer, wherein a Young's modulus of the support frame is less than 1 MPa.

6. The fingerprint recognition device according to claim 1, wherein each of the pixels corresponds to a plurality of micro lenses.

7. The fingerprint recognition device according to claim 1, further comprising a collimation layer disposed between the image sensing layer and the micro-lens layer, wherein the collimation layer comprises a light blocking layer and a plurality of light transmitting holes, and the light transmitting holes correspond to the micro lenses, respectively.

8. The fingerprint recognition device according to claim 7, wherein the micro-lens layer further comprises a plurality of dummy micro lenses, and the number of the light transmitting holes corresponding to each of the dummy micro lenses is less than the number of the light transmitting holes corresponding to each of the micro lenses.

9. The fingerprint recognition device according to claim 1, wherein the light emitting layer is a self-illuminating light emitting panel.

10. The fingerprint recognition device according to claim 1, further comprising a support frame disposed between the micro-lens layer and the light emitting layer, wherein a Young's modulus of the support frame is greater than or equal to 1 MPa.

* * * * *